United States Patent [19]

Spychalski

[11] Patent Number: 4,644,505

[45] Date of Patent: Feb. 17, 1987

[54] BROADBAND MATCHING NETWORK

[75] Inventor: Stephen E. Spychalski, Gulfport, Miss.

[73] Assignee: The United States of America as represented by the Secretary of the Navy, Washington, D.C.

[21] Appl. No.: 619,436

[22] Filed: Jun. 11, 1984

[51] Int. Cl.$^4$ .............................................. H03H 5/00
[52] U.S. Cl. ...................................... 367/15; 367/176; 367/189
[58] Field of Search ..................... 367/13, 14, 189, 22, 367/65, 49, 100, 176, 152, 15

[56] References Cited

U.S. PATENT DOCUMENTS

| 3,939,468 | 2/1976 | Mastin | 367/22 |
| 3,943,304 | 3/1979 | Piribauer | 179/105 |
| 4,107,660 | 8/1978 | Chelboun | 340/566 |

OTHER PUBLICATIONS

Spychalski et al, "Deep-Towed Seismic System: A Hardware Description", Geophysics, vol. 48, No. 4, p. 431, Apr. 1983.
Woollett, "Basic Problems Caused by Depth and Size Constraints in Low-Frequency Underwater Transducers", J. Acoust. Soc. Am, pp. 1031-1037, Oct. 1980.
Fitzgerald et al, Electric Machinery, 1983, pp. 38-45.

Primary Examiner—Thomas H. Tarcza
Assistant Examiner—D. T. Pihulic
Attorney, Agent, or Firm—T. M. Phillips

[57] ABSTRACT

A broadband matching network for a Helmholtz resonator transducer is a series RL matching network capable of withstanding a high power level. The usable acoustic broadwidth is expanded to produce a symmetrical output over a broad frequency band.

2 Claims, 3 Drawing Figures

BROADBAND MATCHING NETWORK

BACKGROUND OF THE INVENTION

1. Field of the Invention

The present invention relates to electrical matching networks, and more particularly to a broadband matching network for use with a Helmholtz acoustic resonator in deep water.

2. Description of the Prior Art

As acousticians become increasingly more interested in the lower regions of the acoustic frequency domain, concern has increased over the modeling of the ocean floor and its accompanying sublayers as transmission media that refract, diffract, diffuse and dissipate as well as reflect sound waves that eventually reach a receiving hydrophone in the water column. Geoacoustic and geophysical models of ocean floor acoustic interaction which take all energy paths into account are needed as inputs to acoustic propagation loss calculations. Thus, the development of instrumentation and field measurements systems capable of acquiring the necessary types of geophysical, geoacoustic data with sufficient accuracy, resolution and frequency response is critical.

The technology as developed by the petroleum industry allows the collection on a continuous basis of high resolution layered structure, interface reflectivity as a function of grazing angle, velocity and attenuation as a function of depth, migration of side reflections to true position, and direct interpretation of lithology and saturating pore fluid. Presently these data are collected using surface sources and receivers, but the measurement geometries are such that this is possible only in shallow water. However, if a near-bottom source and receiver array is used, the geometries are identical to shallow-water techniques, and a wealth of proven processing technology becomes available. Specifically, if the outputs of a sequence of hydrophones spaced over a distance which is long in relation to receiver-bottom distance is individually recorded, along with an acoustic source keyed from the surface and in line with the hydrophones, and if such a device is towed near the sea floor in the deep ocean, such a geometry is achieved.

A Helmholtz resonator transducer is used as the acoustic source and has an operating bandwidth in the lower regions of the acoustic frequency domain. However, the output of the Helmholtz resonator transducer is asymmetrical in shape, reducing the acoustic usable bandwidth. What is desired is means for expanding the acoustic usable bandwidth with a concomitant reduction in input pulse power for a given output pulse power.

SUMMARY OF THE INVENTION

Accordingly, the present invention provides a broadband matching network for a Helmholtz resonator transducer which expands the acoustic usable bandwidth with a concomitant reduction in input pulse power for a given output pulse power. An input power pulse is amplified and input to an isolation transformer. The output of the transformer is input to a series RL matching network capable of withstanding a high power level, and thence to the Helmholtz resonator transducer to produce a symmetrical output over a broad acoustic frequency band.

Therefore, it is an object of the present invention to provide a broadband matching network for a Helmholtz resonator transducer capable of broadening the usable acoustic bandwidth while withstanding high power levels.

Other objects, advantages and novel features of the present invention will be apparent from the following detailed description when read in conjunction with the appended claims and attached drawing.

DESCRIPTION OF THE PREFERRED EMBODIMENT

Figure 1:
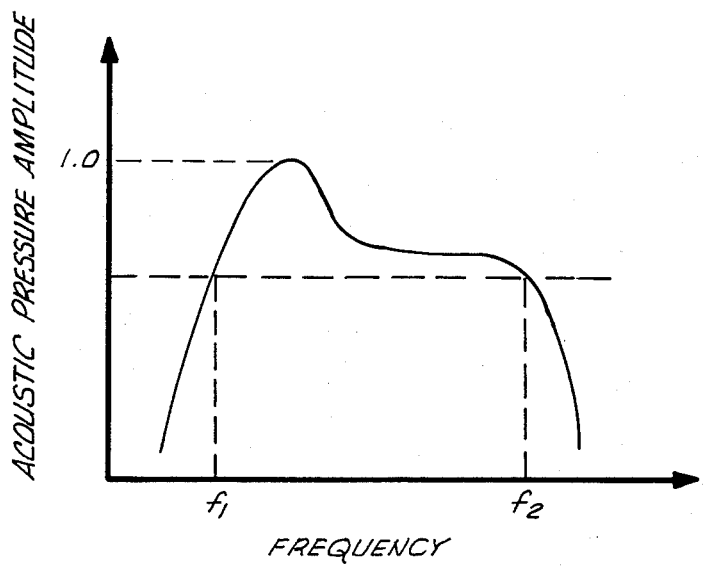
FIG. 1 is a frequency spectrum for the pulse output from a Helmholtz resonator transducer.
Figure 2:
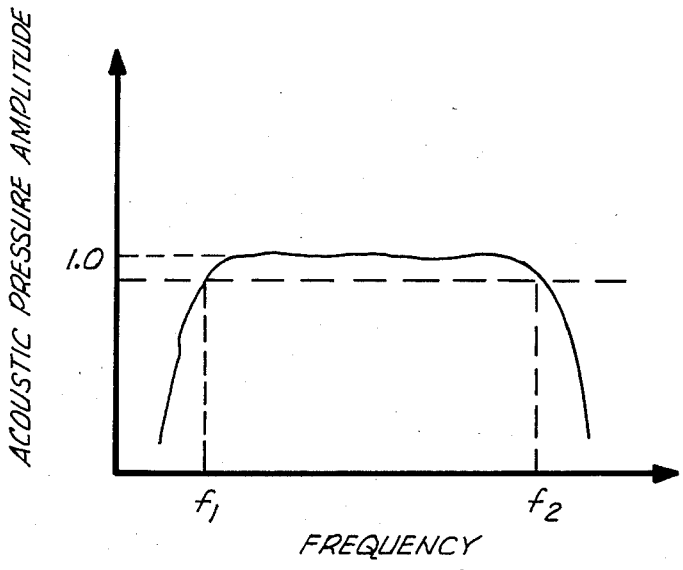
FIG. 2 is a frequency spectrum for the pulse output from the Helmholtz resonator transducer with the broadband matching network of the present invention.

FIGS. 1 and 2 illustrate the difference between the pulsed output of a Helmholtz resonator transducer and an ideal pulsed output. Ideally a flat response curve is desired between cutoff points so that complicated correction factors do not have to be used to process data received from such a pulse. However, at lower frequencies for a given power input pulse the Helmholtz resonator transducer has a greater amplitude which renders one-half of the frequency spectrum unusable without such expensive correction circuits or time-consuming correction data processing.

Figure 3:
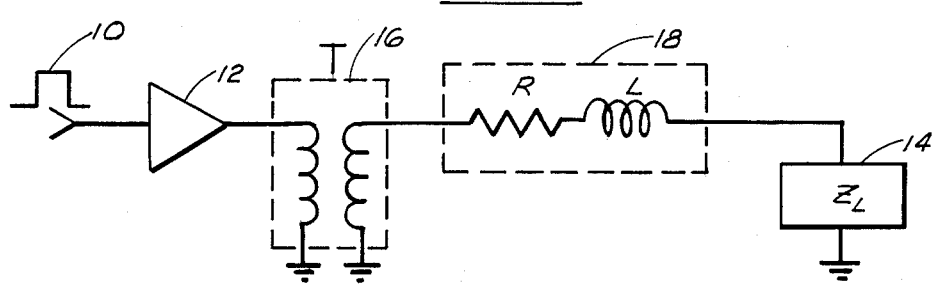
FIG. 3 is a schematic diagram of the broadband matching network of the present invention.

As shown in FIG. 3 a transmit pulse 10 is amplified by an amplifier 12 to a high power, such as 16 Kva. The high power pulse is transferred to a Helmholtz resonator transducer 14, represented by the load impedance $Z_L$, via an isolation transformer 16. Between the Helmholtz resonator transducer 14 and the transformer 16 is a broadband impedance matching circuit 18 which together with the impedance $Z_L$ of the Helmholtz resonator transducer combines to produce a flat response over the frequency spectrum of the Helmholtz resonator transducer. The broadband impedance matching circuit 18 is a series RL circuit having components capable of withstanding high power levels. For example, representative values for R and L are: R=150 ohms, 200 w and L=100 mH, 35 Kva. The result is a doubling of the usable acoustic broadwidth to 400 Hz for the Helmholtz resonator transducer 14 with a reduction in input pulse power for a given output pulse power.

Thus, the present invention is a broadband matching network for a Helmholtz resonator transducer which increases usable acoustic broadwidth while decreasing required input pulse power.

What is claimed is:

1. A broadband matching network for a Helmholtz resonator transducer comprising a series RL circuit between an isolation transformer and said Helmholtz resonator transducer, said series RL circuit being capable of resisting high power levels and of shaping the output frequency response curve of said Helmholtz resonator transducer to provide an essentially flat response over the frequency range of said Helmholtz resonator transducer.

2. A broadband matching network as recited in claim 1 wherein said series RL circuit comprises:
   a resistor having a value of approximately 150 ohms at a power rating of 200 w; and
   an inductor connected in series with said resistor, said inductor having a value of approximately 100 mH at a power rating of 35 Kva.

* * * * *